United States Patent
Mikkola et al.

(10) Patent No.: US 6,981,202 B2
(45) Date of Patent: Dec. 27, 2005

(54) METHOD AND SYSTEM FOR ALLOCATING CONVOLUTIONAL ENCODED BITS INTO SYMBOLS BEFORE MODULATION FOR WIRELESS COMMUNICATION

(75) Inventors: Hannu Mikkola, Tampere (FI); Janne Vainio, Lempäälä (FI); Jani Rotola-Pukkila, Tampere (FI)

(73) Assignee: Nokia Corporation, Espoo (FI)

( * ) Notice: Subject to any disclaimer, the term of this patent is extended or adjusted under 35 U.S.C. 154(b) by 591 days.

(21) Appl. No.: 10/040,885

(22) Filed: Jan. 2, 2002

(65) Prior Publication Data

US 2002/0133781 A1 Sep. 19, 2002

Related U.S. Application Data

(60) Provisional application No. 60/260,258, filed on Jan. 8, 2001.

(51) Int. Cl.[7] .......................... H03M 13/03; G01R 31/28
(52) U.S. Cl. ......................................... 714/790; 714/781
(58) Field of Search ................................. 714/788, 755, 714/756, 789, 790, 784, 791, 792; 375/262, 265

(56) References Cited

U.S. PATENT DOCUMENTS

| | | | | |
|---|---|---|---|---|
| 5,511,096 A | * | 4/1996 | Huang et al. ................ | 375/265 |
| 5,909,454 A | | 6/1999 | Schmidt | |
| 6,347,122 B1 | * | 2/2002 | Chen et al. ................... | 375/262 |

FOREIGN PATENT DOCUMENTS

WO    WO 99 17509    4/1999

OTHER PUBLICATIONS

*3rd Generation Partnership Project; Technical Specification Group Services and System Aspects; Mandatory Speech Codec speech processing functions AMR speech codec; Transcoding functions* (3G TS 26.090 version 3.1.0); Dec. 1999; published on the Internet.

*3rd Generation Partnership Project; Technical Specification Group Services and System Aspects; Mandatory Speech Codec speech processing functions AMR Wideband speech codec; Transcoding functions* (3G TS 26.190 version 1.0.0); Nov. 2000; published on the Internet.

*Digital cellular telecommunications systems (Phase 2+); Channel coding* (GSM 05.03 version 8.5.0 Release 1999), ETSI EN 300 909; Jul. 2000; published on the Internet.

*Digital cellular telecommunications system (Phase 2+); Modulation* (GSM 05.04 V8.1.0); Dec. 1999; published on the Internet.

"Multilevel Trellis Coded Modulations for the Rayleigh Fading Channel," N. Seshadri et al., IEEE Transactions on Communications, vol. 1, No. 9, Sep. 1, 1993, pp. 1300–1310.

* cited by examiner

*Primary Examiner*—Guy J. Lamarre
*Assistant Examiner*—James C. Kerveros
(74) *Attorney, Agent, or Firm*—Ware, Fressola, Van Der Sluys & Adolphson LLP

(57) ABSTRACT

A method and corresponding apparatus for encoding a sequence of bits for transmission as symbols, some of the bit positions of the symbols having a higher bit error rate than other bit positions. A plurality of sequences of bits is provided using a convolutional encoder, in response to a sequence of input bits, each sequence of bits being defined by a predetermined generator polynomial having a predetermined level of sensitivity to puncturing. Then the bits of each sequence of bits are mapped to symbol positions based on the level of sensitivity of the generator polynomial defining the sequence of bits. With interleaving, the mapping of bits of each sequence of bits to symbol positions can precede a symbol interleaving step, or it can follow a bit interleaving step.

34 Claims, 7 Drawing Sheets

METHOD AND SYSTEM FOR ALLOCATING CONVOLUTIONAL ENCODED BITS INTO SYMBOLS BEFORE MODULATION FOR WIRELESS COMMUNICATION

CROSS REFERENCE TO RELATED APPLICATION

Reference is made to and priority claimed from U.S. provisional application Ser. No. 60/260,258, filed Jan. 8, 2001, entitled THE ALLOCATION OF CONVOLUTIONAL ENCODED BITS INTO SYMBOLS BEFORE MODULATION.

FIELD OF THE INVENTION

The present invention relates to cellular telecommunications, and more particularly to channel coding for speech parameters based on convolutional codes.

BACKGROUND OF THE INVENTION

In a modern cellular system, some modulation schemes are used to transmit several bits at a time, i.e. as a single symbol, as in for example the 8-PSK modulation anticipated to be used in the forthcoming EDGE, i.e. Enhanced Data rates for the Global System for Mobile Communications (GSM) Evolution. The use of such modulation schemes typically results in different error probabilities for the different bits of a symbol. For example, in case of the 8-PSK modulation designed for EDGE, there are three bits transmitted in every symbol (see ETSI (European Telecommunications Standards Institute) specification GSM 05.04, section 3.2, explaining that modulating bits are Gray mapped in groups of three to 8PSK symbols) and the bit error rate (BER) for one of the bits is approximately double compared to the BER for each of the other two bits. In contrast, GSM currently uses the so-called GMSK (Gaussian minimum shift keying) modulation scheme where only one bit is transmitted per symbol and hence the BER for each received bits is the same. An optimum codec (coder/decoder) for a system transmitting several bits per symbol must take into account the uneven BER in multi-bit per symbol modulation schemes because in forward error correction coding, involving convolutional encoding, the bits of the convolutional encoded bit stream do not have even error resilience, i.e. errors in some bits are more critical than errors occurring in other bits.

Special attention should be focused on designing a proper interleaver for the codec of such a system. There are mainly two kinds of interleaver design: a bit interleaver design and a symbol interleaver design. A symbol interleaver interleaves symbols, keeping the bits belonging to each symbol together, while a bit interleaver interleaves an entire bit sequence on bit-per-bit basis.

If a symbol interleaving design is used, the encoded bits would have to be processed according to some algorithm, before the interleaver in order to enhance the error protection performance by controlling the allocation of the bits into symbols. On the other hand, if a bit interleaving design is used, a similar or the same algorithm would again be used, but it would act on the bits after the interleaver.

In prior art systems, a convolutional encoded and possibly punctured bit sequence (a bit sequence where some of the bits, called the punctured bits, have been removed) is interleaved before modulation, as shown in FIGS. 1 and 2. The interleaving operation is vital when convolutional codes are used, because such codes are designed to cope well with random errors but their performance decreases dramatically if the errors are bursty (and if interleaving is not used).

Interleaving ensures that consecutive bits are not sent in the same radio burst and also that neighboring bits in the convolutional encoded sequence are maximally separated within the burst before transmission [see ETSI specification GSM 05.03]. Thus, interleaving tends to ensure that errors occurring in a transmission channel will be distributed as evenly as possible over each entire encoded speech frame, i.e. the errors will appear to be randomly distributed, not bursty. Interleaving is a very common and powerful way to improve error protection performance because most codes are designed to be robust against randomly distributed errors, not bursty errors.

According to the prior art, however, the same kind of interleaving is typically used regardless of the modulation scheme. But when using modulation schemes where the error probability for each bit within a symbol is not even, the interleaving procedure should be adapted to take into account the uneven bit error rate.

One situation where the need to take into account the uneven bit error rate is relevant is in a system using 8-PSK modulation (or any multi-level modulation scheme).

When using a modulation scheme transmitting N bits per symbol, obviously the N-bit symbols must be constructed from the bit sequence before modulation. To do so, the very well known N-bit serial-to-parallel conversion is used. As illustrated in FIGS. 1 and 2, a module 13 performing the N-bit serial-to-parallel conversion is located before the interleaver if a symbol interleaver 14 is used (FIG. 1), and after the interleaver if a bit interleaver 24 is used (FIG. 2). The prior art solution where the conversion is performed after the bit interleaver is described in ETSI specification GSM 05.03 (which sets out in sections 3.11 through 3.13, channel coding for ECSD data channels, i.e. Enhanced Circuit Switched Data, an EDGE version of HSCSD (High Speed Circuit Switched Data) in that ECSD is HSCSD with GMSK modulation changed to 8PSK modulation).

FIG. 5 illustrates the operation of a prior art system where a symbol interleaver is used and serial-to-parallel conversion is located after the interleaver (as in FIG. 1). In the example illustrated in FIG. 5, a 1/3 rate punctured convolutional code is used with 8-PSK modulation (3 bits/symbol). No special actions are taken to control the allocation of convolutional encoded and punctured bits into three-bit symbols. The constructed symbols are fed into the symbol interleaver, which can be based on a block diagonal bit interleaver (as set out in for example GSM 05.03), modified to interleave symbols instead of single bits.

If a symbol interleaver is used in a system, the prior art does guarantee optimal interleaving at the symbol level, but not at the bit level, as can be seen from FIG. 5, where consecutive bits from a puncturing module are transmitted in the same symbol. Such a system leads to more bursty errors for decoding states of the convolutional code, and hence decreases the error protection performance of the code. Such a problem does not occur when using a bit interleaver.

The main non-optimality of the prior art relates to the fact that it does not control the allocation of the encoded bits from a given generator polynomial to a given position within a symbol (if different bit positions within the symbol have different error probabilities, as is usually true). This problem is described below in more detail.

A convolutional encoder, which is usually implemented as a shift register, can be completely described by a connection diagram, such as the connection diagram 110 of FIG. 1A for a rate R=1/2 encoder (2 output bits for every input bit), showing three delay elements 111a, 111b, 111c, and two adders 112, 114. The code rate R is in general written as k/n indicating that the encoder maps a k-tuple to an n-tuple. It is possible to more concisely describe an encoder than by providing a connection diagram. One more concise specification can be given by stating the values of n, k, and the so-called constraint length K (defined in different ways, such as the number of k-tuples that affect the formation of each n-tuple during encoding). For the encoder of FIG. 1A, n=2, k=1, and K=3. Another way is to give the adder connections in the form of vectors or generator polynomials. For example, the rate 1/2 code of FIG. 1A has the generator vectors $g_1$=111 and $g_2$=101, or equivalently, the generator polynomials $g_1(x)=x^2+x+1$ and $g_2(x)=x^2+1$, where x is the delay. (x implies a delay of one sample, $x^2$ implies a two samples, and so on.

In the example of the encoder illustrated in FIG. 5, the code rate of the 1/3 convolutional code matches perfectly with the number of the bits sent in one symbol, namely three, enabling the allocation of all the bits from one generator polynomial to a certain position within each transmitted symbol, and specifically, allocating the output bits from certain polynomials to strong bit positions and allocating the output bits of other polynomials to weak bit positions. (In 8-PSK modulation, one bit out of the three bits of each symbol has twice the bit error rate as the other two bits. The bit with the higher bit error rate is termed the weak bit, and the other two are called strong bits.) However, if there is any puncturing done after convolutional encoding (as is shown in FIG. 5, and also as in all state of the art channel codecs for speech coding), the allocation of the output bits of the polynomials of the encoder must be made using a more advanced algorithm. It can be seen that at the start of the allocation, the bits from polynomials A and B are allocated to strong bit positions, while bits from polynomial C are allocated to weak bit positions. However, due to puncturing, some bits from polynomials A and B are later allocated to weak bit positions, which is not what is wanted. The unintended allocations reduce the error correction performance of the code, because polynomials A and B in this example are more sensitive to errors in the transmission channel. Whether a polynomial is sensitive is learned by carrying out extensive simulations. (Note that the same problem also arises when the rate of the convolutional code does not match the number of bits to be transmitted as one symbol.)

What is needed is an algorithm, in the case of convolutional encoders that transmit multiple bits per symbol, for separately allocating the bits output by each polynomial of such an encoder into the different positions within a transmitted symbol, an algorithm that takes into account the different error probabilities of the different bits of a symbol provided by such an encoder, so as to improve the error protection performance of the encoder.

SUMMARY OF THE INVENTION

Accordingly, in a first aspect of the invention, a method is provided for encoding a sequence of bits for transmission via a transmission channel as symbols consisting of a plurality of bits, some of the bit positions of the symbols having a higher bit error rate than other bit positions, the method including: a step of providing a plurality of sequences of bits using a convolutional encoder, in response to a sequence of input bits, each sequence of bits being defined by a predetermined generator polynomial having a predetermined level of sensitivity to puncturing; and a step of mapping the bits of each sequence of bits to symbol positions based on the level of sensitivity of the generator polynomial defining the sequence of bits.

In accord with the first aspect of the invention, the method may also include a step of interleaving. Further, the interleaving may be bit interleaving, and the step of providing a mapping may be performed after the step of bit interleaving. Alternatively, the interleaving may be symbol interleaving, and the step of providing a mapping may be performed before the step of symbol interleaving.

Also in accord with the first aspect of the invention, in the step of providing a plurality of sequences of bits using a convolutional encoder, at least one of the sequences of bits may be punctured after using the convolutional encoder in order to fit the at least one sequence of bits into a transmission channel. Further, the amount of puncturing of each sequence may depend on the level of sensitivity of the polynomial defining the sequence.

Also in accord with the first aspect of the invention, in the step of providing a plurality of sequences of bits using a convolutional encoder, at least one of the sequences of bits may be punctured after using the convolutional encoder in order to fit the at least one sequence of bits into a transmission channel, and the amount of puncturing of each sequence may depend on the level of sensitivity of the polynomial defining the sequence. Further, the method may also include a step of interleaving. Also further, the interleaving may be bit interleaving, and the step of providing a mapping may be performed after the step of bit interleaving. Alternatively, the interleaving may be symbol interleaving, and the step of providing a mapping may be performed before the step of symbol interleaving.

In a second aspect of the invention, a method is provided for decoding a sequence of bits encoded for transmission via a transmission channel as symbols consisting of a plurality of bits, some of the bit positions of the symbols having a higher bit error rate than other bit positions, the method including steps that are the inverse of the steps performed in encoding a sequence of bits according to the first aspect of the invention, and in particular including: a step, responsive to received symbols, of demapping the symbols back to a plurality of sequences of bits, each sequence of bits being defined by a predetermined generator polynomial having a predetermined level of sensitivity to puncturing, the demapping based on the level of sensitivity of a generator polynomial defining a respective one of the sequences of bits; and a step, responsive to the plurality of sequences of bits, of providing outputs bits using a convolutional decoder.

In a third aspect of the invention, a transmitting apparatus is provided for encoding a sequence of bits for transmission via a transmission channel as symbols consisting of a plurality of bits, some of the bit positions of the symbols having a higher bit error rate than other bit positions, the apparatus including: means for providing a plurality of sequences of bits using a convolutional encoder, in response to a sequence of input bits, each sequence of bits being defined by a predetermined generator polynomial having a predetermined level of sensitivity to puncturing; and means for mapping the bits of each sequence of bits to symbol positions based on the level of sensitivity of the generator polynomial defining the sequence of bits.

In accord with the third aspect of the invention, the transmitting apparatus may also include means for interleaving. Further, the means for interleaving may perform bit interleaving, and the means for mapping may be operative after the means for interleaving. Alternatively, the means for interleaving may perform symbol interleaving, and the means for providing a mapping may be operative before the means for interleaving. Also further, the means for providing a plurality of sequences of bits using a convolutional encoder may include, after the convolutional encoder, means for puncturing at least one of the sequences of bits in order to fit the at least one sequence of bits into a transmission channel, and the means for puncturing may provide puncturing of each sequence in an amount that depends on the level of sensitivity of the polynomial defining the sequence.

Also in accord with the third aspect of the invention, the means for providing a plurality of sequences of bits using a convolutional encoder may include, after the convolutional encoder, means for puncturing at least one of the sequences of bits in order to fit the at least one sequence of bits into a transmission channel. Further, the transmitting apparatus may also include means for interleaving. Further still, the means for interleaving may perform bit interleaving, and the means for providing a mapping may be operative after the means for interleaving. Alternatively, the means for interleaving may perform symbol interleaving, and the means for providing a mapping may be operative before the means for interleaving. Also further, the means for puncturing may provide puncturing of each sequence in an amount that depends on the level of sensitivity of the polynomial defining the sequence.

In a fourth aspect of the invention, a receiving apparatus is provided for decoding a sequence of bits encoded for transmission via a transmission channel as symbols consisting of a plurality of bits, some of the bit positions of the symbols having a higher bit error rate than other bit positions, the apparatus including means for performing the inverse of the operations performed in encoding a sequence of bits according to the first or third aspect of the invention, and in particular including: means, responsive to received symbols, for demapping the symbols back to a plurality of sequences of bits, each sequence of bits being defined by a predetermined generator polynomial having a predetermined level of sensitivity to puncturing, the demapping based on the level of sensitivity of a generator polynomial defining a respective one of the sequences of bits; and means, responsive to the plurality of sequences of bits, for providing outputs bits using a convolutional decoder.

Thus, by changing the serial-to-parallel block (module) of an encoder to a special functional block (called here a mapping block), a block that is positioned before the symbol interleaving block of a symbol interleaving encoder, or after the bit interleaving block of a bit interleaving encoder, the allocation of bits from each generator polynomial of the encoder can be separately controlled. In case of a symbol interleaver encoder, the mapping block also allocates sequential bits from a puncturing block (module) to different symbols to further prevent channel errors from being burst-wise distributed at the input of the convolutional decoder.

In principle, the mapping block of the invention could be combined with the interleaver block of the prior art. However, especially with multi-rate codecs (such as AMR-NB or AMR-WB, as set out in 3GPP26.090 and 3GPP26.190 respectively), it is advantageous to separate the mapping block of the invention from the interleaving block because then the interleaver can be generic (in that its function need not be specified separately for every mode of the encoder); only the mapping operation then differs from mode to mode. However the mapping algorithm can also be implemented as a generic algorithm, using the codec mode as one input parameter, and so making possible the use of one (generic) mapping algorithm that operates differently for different codec modes.

For several reasons, the present invention is more practical (easier to implement, requiring less memory because of using fewer tables) for encoders where symbol-interleaving is used (and the mapping block is located before the interleaver block) than for encoders in which bit-interleaving is performed. For one thing, in practice it is difficult to keep track after bit interleaving of the allocation of each output bit of each of the different polynomials, making mapping after bit interleaving a complex process. On the other hand, mapping can be implemented by using lookup tables, reducing complexity but consuming resources; using a lookup table is not always feasible because quite a large table is sometimes needed, and sometimes several different tables are needed. For a multi-rate codec, for example, a separate table is needed for every mode.

For another thing, a symbol interleaver can be based on a corresponding bit interleaver, if available, such as a bit interleaver used in GSM where GMSK channels (full-rate/half-rate) have earlier specified bit interleavers. (According to the invention those same interleavers can also be used for 8-PSK channel codecs simply by rearranging symbols instead of single bits.) If a suitable bit interleaver is available, then the code for the bit interleaver can be adapted for use by the symbol interleaver, and the use of lookup tables (ROM tables) can also be adapted. Furthermore, no optimization is needed for the symbol interleaver design if an optimal bit interleaver is being used for the same system and the same channel with a different modulation scheme, as in the case of GSM, GMSK being changed to 8-PSK. The advantage that no optimization is needed for the interleaver design is very valuable for implementations such as EDGE, where channel codecs for both GMSK and 8-PSK modulations must be provided.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

Figure 1:
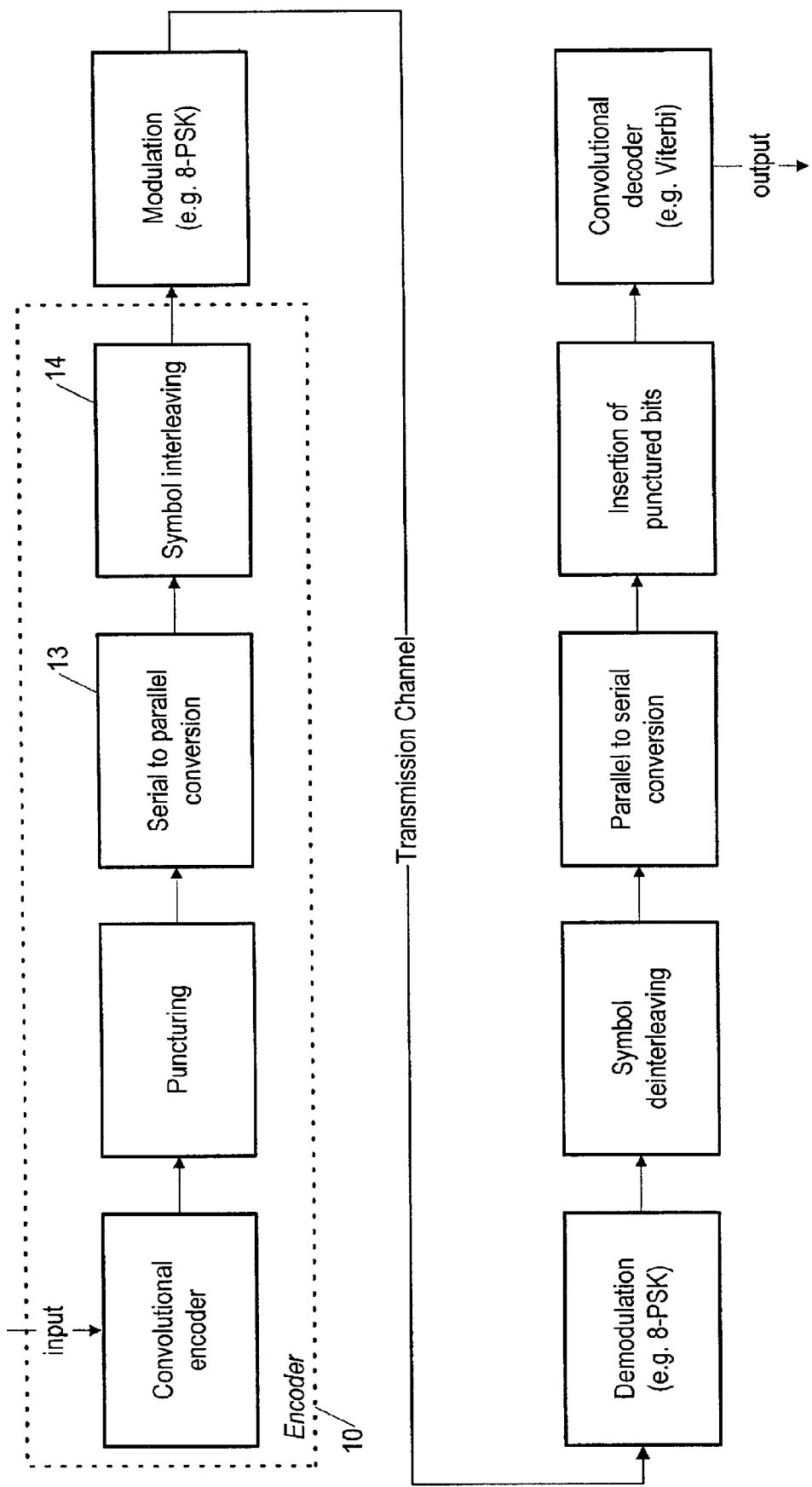
FIG. 1 is a block diagram for a prior art channel codec using symbol interleaver.
Figure 1A:
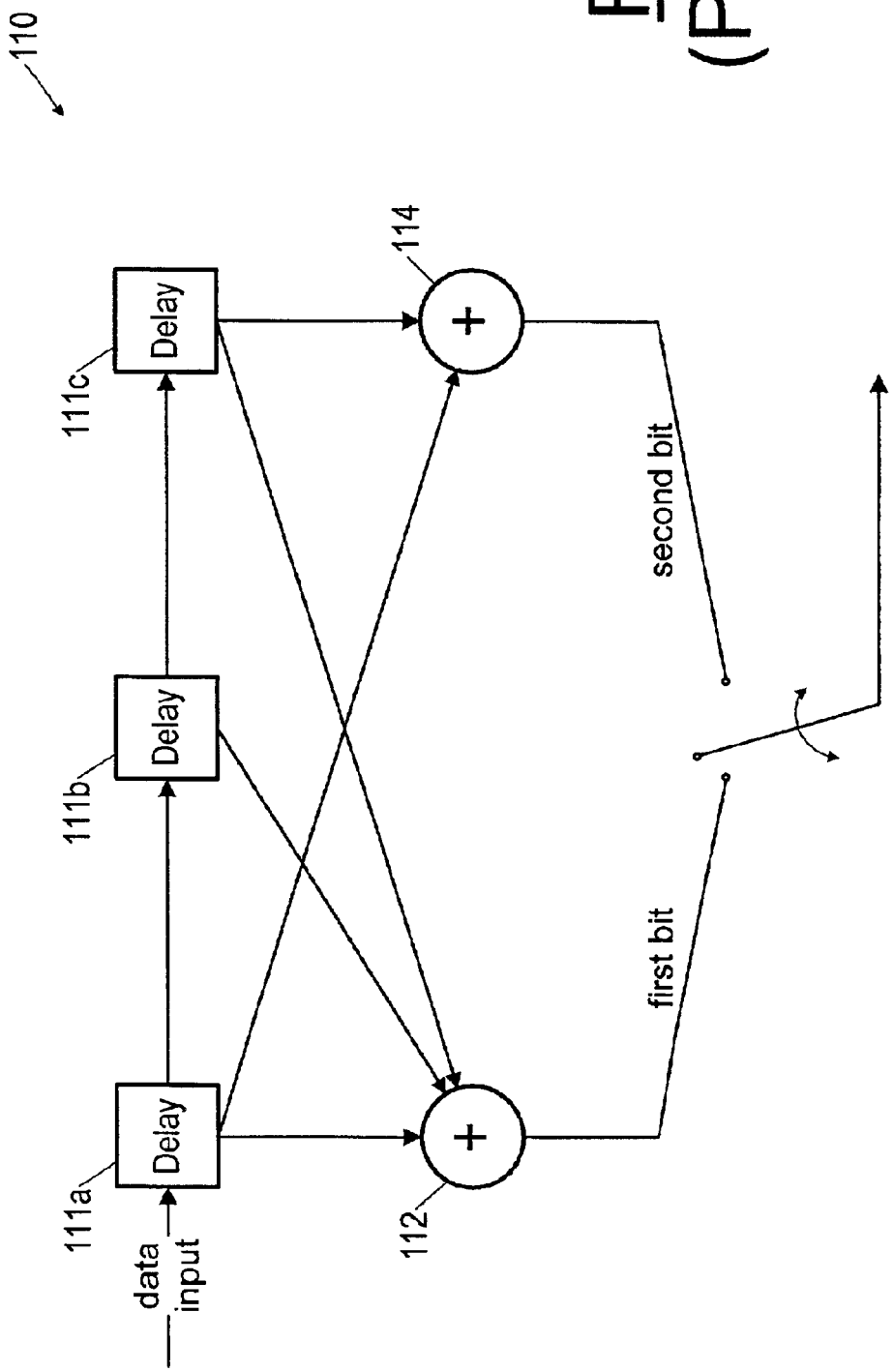
FIG. 1A is a schematic of a shift register implementing a convolutional encoder, according to the prior art.
Figure 2:
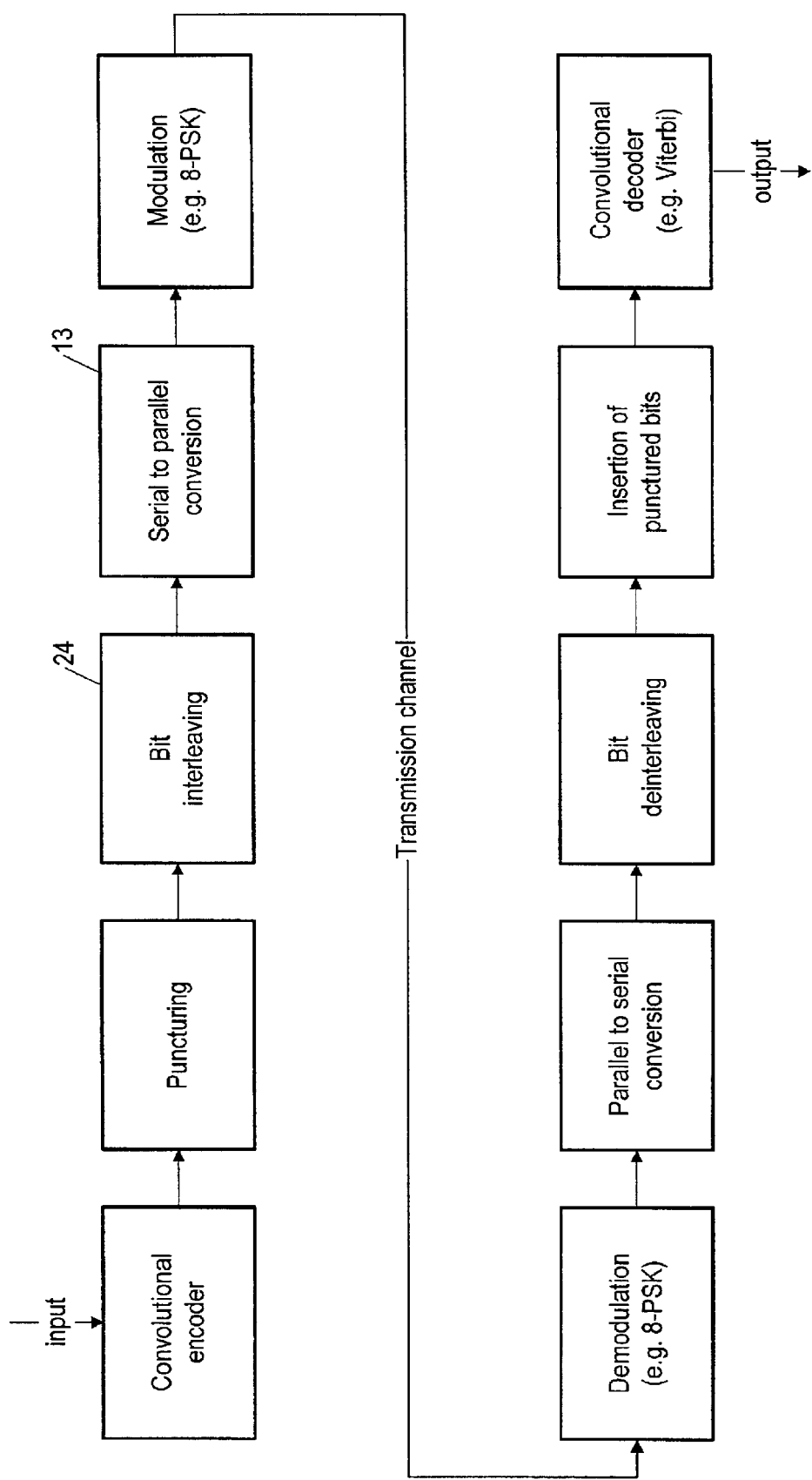
FIG. 2 is a block diagram for a prior art channel codec using bit interleaver.
Figure 3:
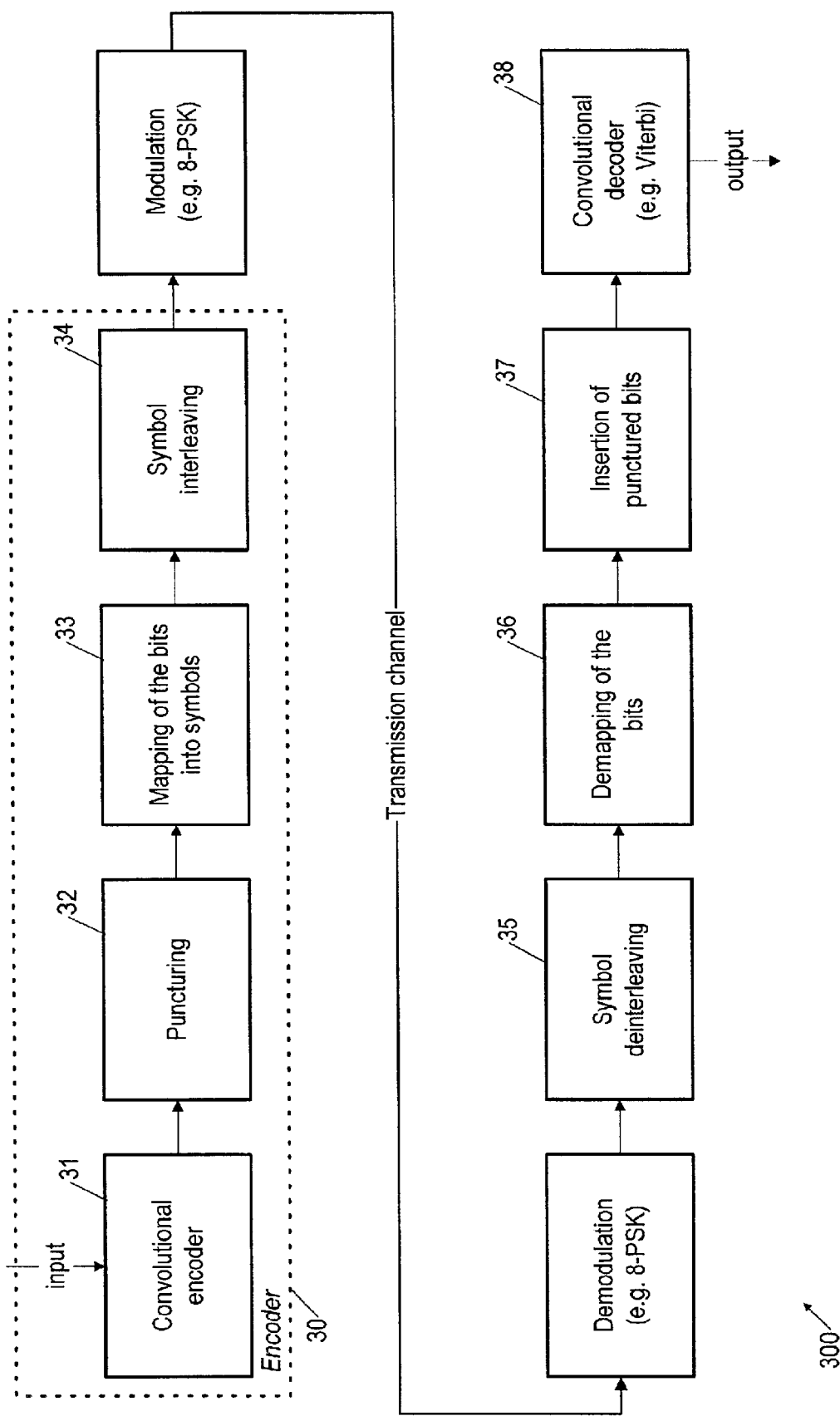
FIG. 3 is a block diagram for a channel codec according to the invention, where the parallel-to-serial conversion module of FIG. 1 is replaced with a mapping module before the symbol interleaver.
Figure 4:
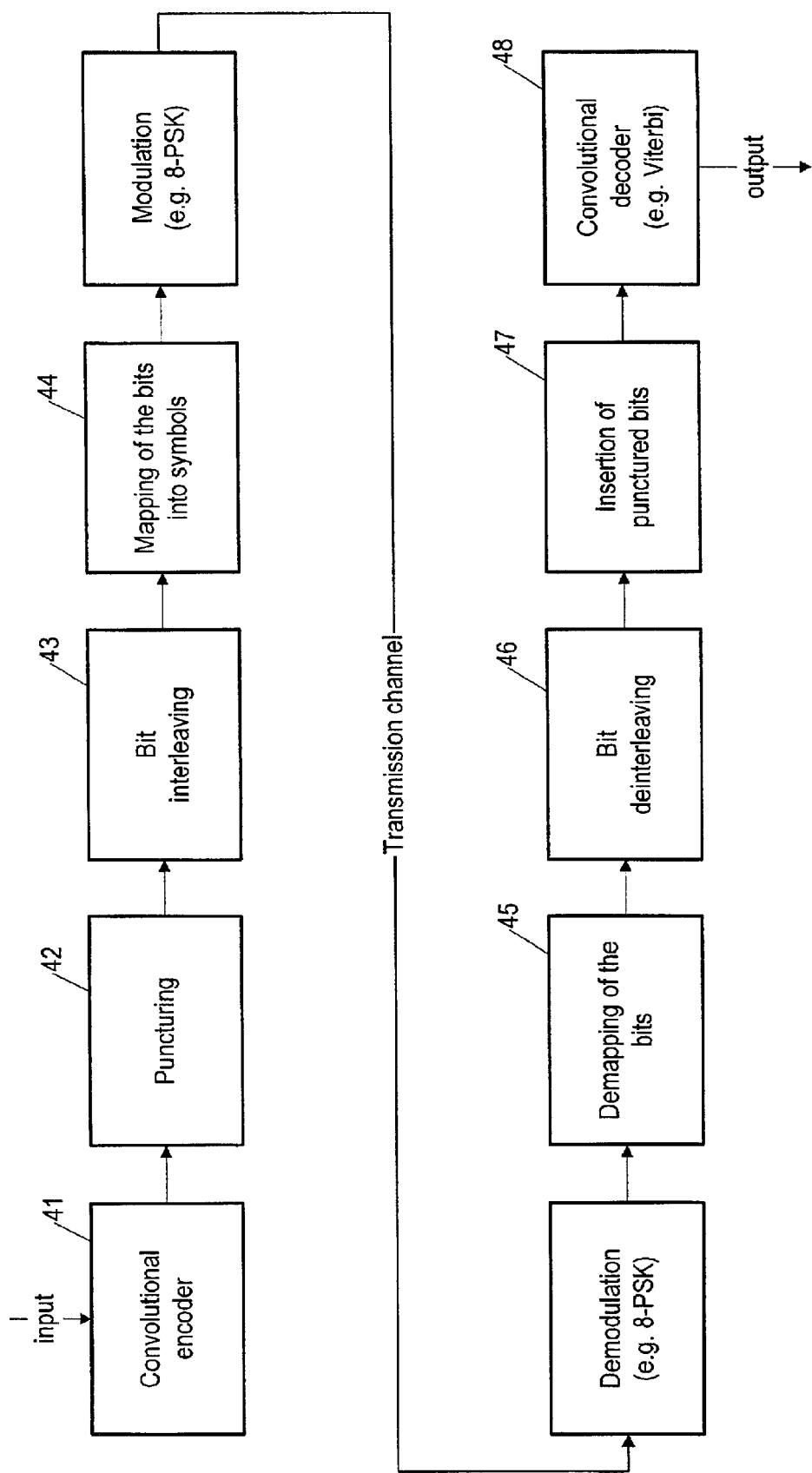
FIG. 4 is a block diagram for a channel codec according to the invention, where the parallel-to-serial conversion module of FIG. 2 is replaced with a mapping module after the bit interleaver.

Referring now to FIGS. 3 and 4, according to the invention, in a channel codec (300, 400) using modulation that transmits multiple bits per symbol where the error probability for each bit within the symbol is not the same, a mapping (33, 44) of the convolutional encoded bits (provided by a convolutional encoder (31, 41)) is performed (after any required puncturing by a puncturing module (32, 42)) so as to optimize the channel codec performance; if the channel codec includes a symbol interleaving module 34, as shown in FIG. 3, the mapping 33 of the invention is performed before the interleaving; and if the channel codec includes a bit interleaving module 43, as shown in FIG. 4, the mapping 44 is performed after the interleaving. The mapping 33 44 of the invention replaces the serial to parallel conversion module 13 (FIGS. 1 and 2) of the prior art.

In the prior art, weaker bits are evenly distributed among stronger bits, decreasing the error protection performance of the convolutional code; the extent of the decrease in error protection caused by evenly distributing weaker bits among stronger bits depends on what polynomials are used in the convolutional encoding and how the bits from each polynomial are allocated to the symbols. The effect caused by the weak bits can be called soft puncturing, because the weak bits decrease the error protection capability of the convolutional code in the same way as (intentional) puncturing using puncturing matrices, but to a lesser extent.

When optimizing a channel codec, the properties of a selected polynomial set are usually very carefully analyzed. Such an analysis determines how the possible puncturing should be done (i.e. which polynomials to puncture and which not to puncture, and whether or not to use a recursive code). (Puncturing is done to match the number of convolutional encoded bits to the number of bits that can actually be sent, and the analysis has as a goal determining how to do the puncturing so as to obtain the required matching and yet decrease the error protection performance of the convolutional code as little as possible. Convolutional coding is usually performed with rates where the numerator is unity, i.e. e.g. 1/2, so that for each input bit there are two output bits. If the numerator is unity, we cannot directly get coding rates in which the numerator is other than unity, such as 2/3. To do so, we run a 1/2 coding rate and puncture out some coding bits so as to reach the desired coding rate.) It is also very important to find out which polynomial is the most sensitive to puncturing (i.e. puncturing its output), which is the next most sensitive, and so on. Usually the optimum procedure is to puncture only the output of the least sensitive polynomial or those of a few of the least sensitive polynomials and leave the others unpunctured. Also, as a rule of thumb, the outputs of recursive polynomials should usually be left unpunctured.

The error protection performance of a convolutional code is greatly improved if the true (or hard) puncturing of the different polynomials of the code is independently controlled, i.e. if puncturing of each polynomial is optimized in the design phase of the channel codec independently of the other polynomials. Likewise, controlling the so-called soft puncturing on a polynomial-by-polynomial basis further improves the error protection performance of a convolutional code, but is not provided for by the prior art, and the mapping of the present invention provides such control.

Figure 5:
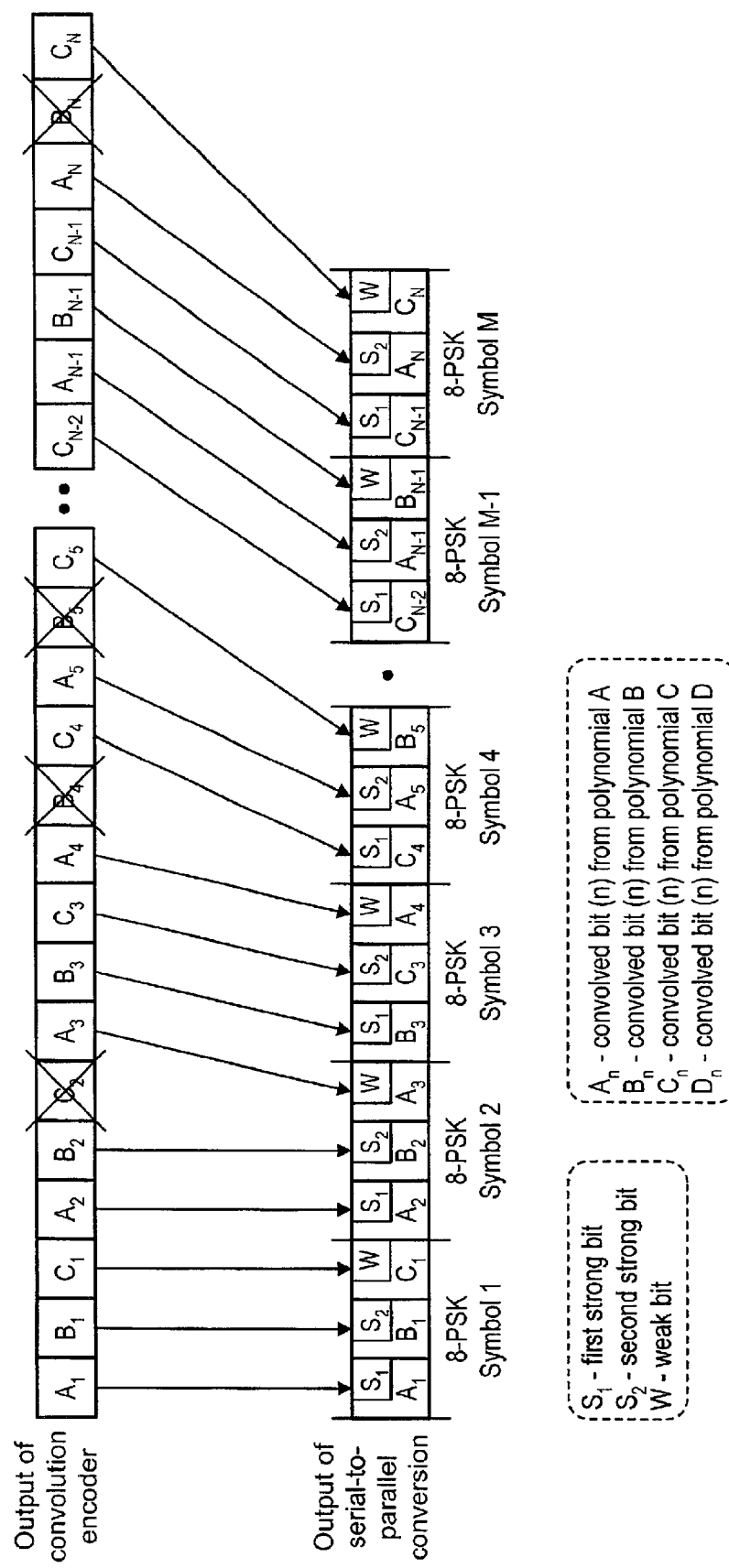
FIG. 5 illustrates a prior art method for allocating convolutional encoded bits before a symbol interleaver in a decoder such as illustrated in FIG. 1, for a 1/3 rate convolutional code.
Figure 6:
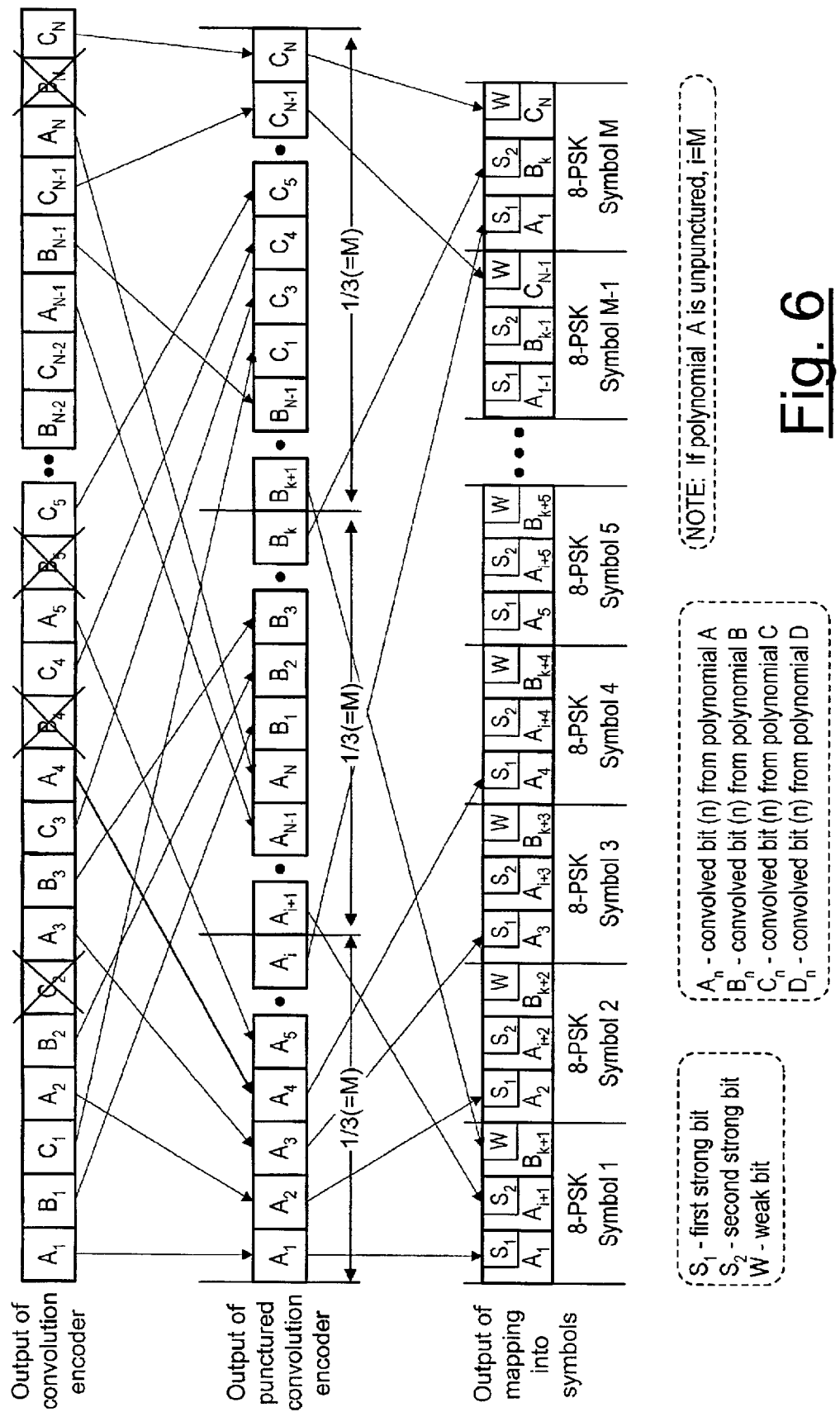
FIG. 6 illustrates a method according to the invention for mapping convolutional encoded bits before a symbol interleaver in a codec such as the codec illustrated in FIG. 3, for a 1/3 rate convolutional code.

Referring now to FIGS. 5 and 6, the output of an encoder according to the prior art (FIG. 5) is compared with the output of an encoder according to the invention (FIG. 6). The prior art encoder that provides the output indicated in FIG. 5 is that illustrated in FIG. 1 (i.e. the encoder subsystem 10), which performs symbol interleaving, and the encoder that provides the output indicated in FIG. 6 is the encoder illustrated in FIG. 3 (i.e. the encoder subsystem 30). The difference between the encoder operation illustrated in FIG. 5 and that of FIG. 6 is that the serial-to-parallel conversion module of the prior art encoder (FIG. 1) is replaced by a mapping module 33 (in FIG. 3) according to the invention.

According to the invention, the allocations of bits output by different polynomials to bit positions in the output stream are made according to the order the polynomials are determined to be important, i.e. determined to be sensitive to (any) puncturing: the more sensitive, the more important. In the example given in FIG. 5 and FIG. 6, the order of importance beginning with the most important is assumed to be A, B and C. Bits from the most important polynomial are allocated to the strongest bit positions of each symbol. When all the bits from the most important polynomial are so allocated, the allocation continues with the bits from the next most important polynomial, and so on, until the bits from the least important polynomial are allocated to the weakest bits of the symbols.

Thus, according to the invention, the mapping module 33 (FIG. 3) arranges that the output sequence of the symbol interleaver 34 allocates all the bits from polynomial A to strong bits, i.e. all the bits are assigned positions in the symbols being transmitted that are less likely to be in error. Not even soft puncturing is performed for polynomial A. (Also note that sequential bits from polynomial A are allocated to sequential symbols, because a properly designed symbol interleaver maximally separates sequential symbols, sometimes even transmitting sequential symbols in separate radio bursts, as set out in GSM05.03.)

In the example of FIG. 6, no soft puncturing of the most important polynomials (A and B) is performed, i.e. no bits from these polynomials are assigned to weak bit positions in the symbols to be transmitted, and hence the error protection performance of the convolutional code specified by the generator polynomials A, B and C is optimized for the modulation scheme.

Referring again to FIGS. 3 and 4, the invention also provides inverse mappings (36, 45) corresponding to the mappings (33, 44). The inverse mappings (indicated as demapping modules (36, 45)) are performed after the inverse interleaving if symbol deinterleaving 35 is performed, and before the inverse interleaving if bit deinterleaving 46 is performed. In receiving symbols transmitted according to the invention and deriving from them the bits encoded and transmitted as the received symbols, a receiver would include not only the inverse mappings (36, 45), but also inverse modules (37, 38, 47, 48) corresponding to the modules (31, 32, 41, 42) for convolutionally encoding (31, 41) and puncturing (32, 42), but in the reverse order in which these operations are performed on the transmitter side. (Each operation on the receiver side corresponds to a respective operation on the transmitter side, and the order of the operations on the receiver side is the reverse of the order on the transmitter side.) The invention can be implemented in the mobile station or on the network side. On the network side, the invention would typically be implemented in the base station, with equipment performing the channel coding and mapping.

Scope of the Invention

It is to be understood that the above-described arrangements are only illustrative of the application of the principles of the present invention. Numerous modifications and alternative arrangements may be devised by those skilled in the art without departing from the spirit and scope of the present invention, and the appended claims are intended to cover such modifications and arrangements.

What is claimed is:

1. A method of encoding a sequence of bits for transmission via a transmission channel as symbols consisting of a plurality of bits, some of the bit positions of the symbols having a higher bit error rate than other bit positions, the method comprising:

a) a step of providing a plurality of sequences of bits using a convolutional encoder, in response to a sequence of input bits, each sequence of bits being defined by a predetermined generator polynomial having a predetermined level of sensitivity to puncturing; and b) a step of mapping the bits of each sequence of bits to symbol positions based on the level of sensitivity of the generator polynomial defining the sequence of bits.

2. A method as in claim 1, further comprising a step of interleaving.

3. A method as in claim 2, wherein the interleaving is bit interleaving, and wherein the step of providing a mapping is performed after the step of bit interleaving.

4. A method as in claim 2, wherein the interleaving is symbol interleaving, and wherein the step of providing a mapping is performed before the step of symbol interleaving.

5. A method as in claim 2, wherein, in the step of providing a plurality of sequences of bits using a convolutional encoder, at least one of the sequences of bits are punctured after using the convolutional encoder in order to fit the at least one sequence of bits into a transmission channel.

6. A method as in claim 5, wherein the amount of puncturing of each sequence depends on the level of sensitivity of the polynomial defining the sequence.

7. A method as in claim 1, wherein, in the step of providing a plurality of sequences of bits using a convolutional encoder, at least one of the sequences of bits are punctured after using the convolutional encoder in order to fit the at least one sequence of bits into a transmission channel.

8. A method as in claim 7, further comprising a step of interleaving.

9. A method as in claim 8, wherein the interleaving is bit interleaving, and wherein the step of providing a mapping is performed after the step of bit interleaving.

10. A method as in claim 8, wherein the interleaving is symbol interleaving, and wherein the step of providing a mapping is performed before the step of symbol interleaving.

11. A method as in claim 7, wherein the amount of puncturing of each sequence depends on the level of sensitivity of the polynomial defining the sequence.

12. A method as in claim 1, wherein, in the step of providing output bits from the plurality of sequences of bits, punctured bits are inserted into at least one of the sequences of bits before using the convolutional decoder.

13. A method of decoding a sequence of bits encoded for transmission via a transmission channel as symbols consisting of a plurality of bits, some of the bit positions of the symbols having a higher bit error rate than other bit positions, the method comprising:

a) a step, responsive to received symbols, of demapping the symbols back to a plurality of sequences of bits, each sequence of bits being defined by a predetermined generator polynomial having a predetermined level of sensitivity to puncturing, the demapping based on the level of sensitivity of a generator polynomial defining a respective one of the sequences of bits; and b) a step, responsive to the plurality of sequences of bits, of providing outputs bits using a convolutional decoder.

14. A method as in claim 13, further comprising a step of deinterleaving.

15. A method as in claim 14, wherein the interleaving is bit deinterleaving, and wherein the step of demapping is performed before the step of bit deinterleaving.

16. A method as in claim 12, wherein the deinterleaving is symbol deinterleaving, and wherein the step of demapping is performed after the step of symbol deinterleaving.

17. A transmitting apparatus for encoding a sequence of bits for transmission via a transmission channel as symbols consisting of a plurality of bits, some of the bit positions of the symbols having a higher bit error rate than other bit positions, the apparatus comprising:

a) means for providing a plurality of sequences of bits using a convolutional encoder, in response to a sequence of input bits, each sequence of bits being defined by a predetermined generator polynomial having a predetermined level of sensitivity to puncturing; and b) means for mapping the bits of each sequence of bits to symbol positions based on the level of sensitivity of the generator polynomial defining the sequence of bits.

18. A transmitting apparatus as in claim 17, further comprising means for interleaving.

19. A transmitting apparatus as in claim 18, wherein the means for interleaving performs bit interleaving, and wherein the means for mapping is operative after the means for interleaving.

20. A transmitting apparatus as in claim 18, wherein the means for interleaving performs symbol interleaving, and wherein the means for providing a mapping is operative before the means for interleaving.

21. A transmitting apparatus as in claim 18, wherein, the means for providing a plurality of sequences of bits using a convolutional encoder includes, after the convolutional encoder, means for puncturing at least one of the sequences of bits in order to fit the at least one sequence of bits into a transmission channel.

22. A transmitting apparatus as in claim 21, wherein the means for puncturing provides puncturing of each sequence in an amount that depends on the level of sensitivity of the polynomial defining the sequence.

23. A transmitting apparatus as in claim 17, wherein, the means for providing a plurality of sequences of bits using a convolutional encoder includes, after the convolutional encoder, means for puncturing at least one of the sequences of bits in order to fit the at least one sequence of bits into a transmission channel.

24. A transmitting apparatus as in claim 23, further comprising means for interleaving.

25. A transmitting apparatus as in claim 24, wherein the means for interleaving performs bit interleaving, and wherein the means for providing a mapping is operative after the means for interleaving.

26. A transmitting apparatus as in claim 24, wherein the means for interleaving performs symbol interleaving, and wherein the means for providing a mapping is operative before the means for interleaving.

27. A transmitting apparatus as in claim 23, wherein the means for puncturing provides puncturing of each sequence in an amount that depends on the level of sensitivity of the polynomial defining the sequence.

28. A system for wireless communication, comprising a base station and a mobile station, wherein either the base station or the mobile station includes a transmitting apparatus as claimed in claim 17.

29. A receiving apparatus for decoding a sequence of bits encoded for transmission via a transmission channel as symbols consisting of a plurality of bits, some of the bit positions of the symbols having a higher bit error rate than other bit positions, the apparatus comprising:
- a) means, responsive to received symbols, for demapping the symbols back to a plurality of sequences of bits, each sequence of bits being defined by a predetermined generator polynomial having a predetermined level of sensitivity to puncturing, the demapping based on the level of sensitivity of a generator polynomial defining a respective one of the sequences of bits; and
- b) means, responsive to the plurality of sequences of bits, for providing outputs bits using a convolutional decoder.

30. A receiving apparatus as in claim 29, further comprising means for deinterleaving.

31. A receiving apparatus as in claim 30, wherein the means for deinterleaving is bit deinterleaving, and wherein the means for demapping is performed before the step of bit deinterleaving.

32. A receiving apparatus as in claim 30, wherein the means for deinterleaving performs symbol deinterleaving, and wherein the means for demapping is operative after the means for deinterleaving.

33. A receiving apparatus as in claim 29, wherein, the means for providing output bits using a convolutional decoder includes, before the convolutional decoder, means for inserting bits into at least one of the sequences of bits.

34. A system for wireless communication, comprising a base station and a mobile station, wherein either the base station or the mobile station includes a receiving apparatus as claimed in claim 29.

* * * * *

UNITED STATES PATENT AND TRADEMARK OFFICE
CERTIFICATE OF CORRECTION

PATENT NO.    : 6,981,202 B2
DATED         : December 27, 2005
INVENTOR(S)   : Hannu Mikkola et al.

It is certified that error appears in the above-identified patent and that said Letters Patent is hereby corrected as shown below:

<u>Column 10,</u>
Line 5, delete "interleaving" and substitute -- deinterleaving --.
Line 8, delete "claim 12" and substitute -- claim 14 --.

Signed and Sealed this

Twenty-eighth Day of March, 2006

JON W. DUDAS
*Director of the United States Patent and Trademark Office*